United States Patent [19]

Wilkinson

[11] Patent Number: 4,626,776

[45] Date of Patent: Dec. 2, 1986

[54] PROGRAMMABLE TEST FIXTURE

[75] Inventor: Alan M. Wilkinson, Cranston, R.I.

[73] Assignee: O. B. Test Group, Inc., Warwick, R.I.

[21] Appl. No.: 618,043

[22] Filed: Jun. 7, 1984

[51] Int. Cl.[4] ............... G01R 15/12; G01R 31/22; G01R 31/26

[52] U.S. Cl. ............... 324/73 PC; 324/158 F; 324/158 P

[58] Field of Search ........... 324/158 F, 158 P, 73 PC, 324/72.5; 339/117 P, 117 R

[56] References Cited

U.S. PATENT DOCUMENTS 3,996,516 12/1976 Luther .................. 324/72.5 X
4,344,033 8/1982 Stowers et al. ........... 324/73 PC X

FOREIGN PATENT DOCUMENTS 2098813 11/1981 United Kingdom ............ 324/158 F

Primary Examiner—Ernest F. Karlsen
Assistant Examiner—Vinh Nguyen
Attorney, Agent, or Firm—Barlow & Barlow Ltd.

[57] ABSTRACT

A circuit board testing apparatus is disclosed which effectively provides two vacuum chambers. A plurality of test probes casings are mounted in a bottom wall, which casings extend upwardly through an intermediate plate, the casings being slidably sealed to the plate. A top wall which has a plurality of apertures therethrough is provided in normal spaced relationship to the intermediate plate, and gasketing means are provided to achieve a vacuum chamber between the top plate and the intermediate plate and between the intermediate plate and the bottom wall by arranging a flexible diaphragm. Vacuum is supplied to the two chambers in a selected sequence for moving the top wall toward the intermediate plate, second vacuum means provided for moving the top wall and intermediate plate toward the bottom wall. By providing probe tips of different lengths in the receptacles, a variety of combinations of circuit testing can be performed, including a functional test in one operation.

5 Claims, 5 Drawing Figures

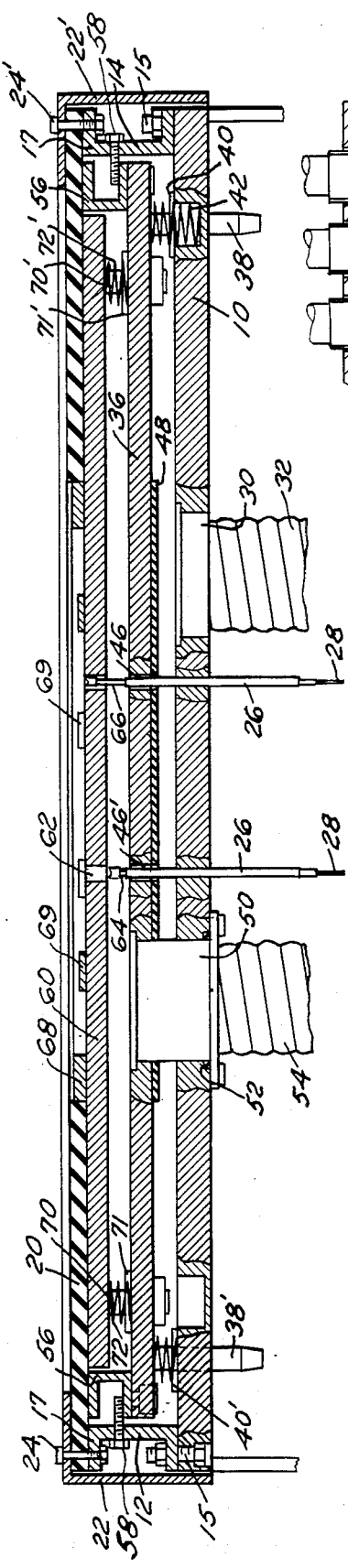

PROGRAMMABLE TEST FIXTURE

BACKGROUND OF THE INVENTION

This invention relates to the field of automatic testing of electronic circuit boards, and more particularly to a programmable test head. Test heads which contain a plurality of test points are generally known in the art. The unit under test is a printed circuit board and the test heads have an array of spring loaded probes that are arranged in a pattern according to the design of the particular circuit under test. Generally vacuum actuating systems are employed which bring the test probes into contact with the printed circuit board, and these probes are in turn connected to an electronic analyzer which determines such things as continuity and proper operation of the electronic circuitry that is mounted on the printed circuit board.

In testing printed circuit boards it has become advantageous to make more than one test on a single board to insure that the sub-circuits are all acting correctly. To accomplish this it has been necessary to utilize a minimum of two test heads for each printed circuit board. This has involved moving a single printed circuit board from one test head to a second test head and conducting separate tests thereon. Obviously this is a time-consuming process and it has therefore been the desire of industry to find a single test head which would have two stages of circuit contact. The only approach in the prior art to this concept is a system disclosed by Stanford in U.S. Pat. No. 4,115,735 where test probes are mounted on two separate platens that are selectively advanced into contact with the printed circuit board under test. This design, however, has certain draw backs in that the test probes of one platen pass through the second platen with sufficient clearance so that there is a severe vacuum leak, particularly when only a portion of the probes are engaged with the circuit board under test.

SUMMARY OF THE INVENTION

The problems and deficiencies of the prior art are overcome with the present invention. Briefly, the present invention is a vacuum test head utilizing two vacuum sources with a plurality of test probes which are mounted on a common bottom wall. The test probes consist essentially of receptacles which receive probes having two distinct lengths. The test head has a top wall on which the printed circuit board under test is received and an intermediate plate through which the receptacles pass being slidably sealed to the plate. By individual conduits, vacuum may be applied between the top wall and the intermediate plate, and another vacuum conduit is arranged to apply vacuum between the intermediate plate and the bottom wall. In a preferred arrangement, vacuum is first applied between the intermediate plate and the top wall, bringing the circuit board under test into contact with the top wall; and then a fraction of a second later, vacuum is applied between the bottom wall and the intermediate wall, drawing both the top wall and the intermediate wall toward the bottom wall, which allows all of the probes to contact the printed circuit board. The vacuum is released between the intermediate plate and the bottom wall a finite time later, and under the urgeance of springs, the intermediate and top wall move upwardly so that only a selected number of probes which are the longer probes, will contact the printed circuit board. In this fashion, two circuit tests may be completed in a few seconds without having to move the printed circuit board from one test head to a second test head. This arrangement increases the productivity of testing over twenty percent.

BRIEF DESCRIPTION OF THE DRAWINGS

FIG. 1 is a partial top plan view of the test fixture with parts broken away;

FIG. 2 is a longitudinal sectional view through a test fixture with parts broken away, made in accordance with the present invention;

FIG. 3 is a partial sectional view showing the test fixture with all of the test probes in contact with the circuit board;

FIG. 4 is a similar partial sectional view showing a portion of the test probes in contact with the circuit board;

FIG. 5 is an enlarged detailed view showing an alternate method of sealing the receptacles of the test probes through the intermediate plate.

DETAILED DESCRIPTION OF THE PREFERRED EMBODIMENTS

Referring now to FIGS. 1 and 2, the test head includes a bottom wall 10 in the form of an insulating material which is of general rectangular form. Attached about the periphery of the bottom wall 10 are four side walls 12, 13 and 14 (one not shown), which are fixed thereto by fasteners such as 15. To insure that there is no air leakage between the side walls and the bottom wall, sealants are used in the joint therebetween as well as suitable sealants are used at the butt junctions at the corners, as at 16. As illustrated the side walls 12, 13 and 14 have been shown as channel-shaped. Each of the walls, therefore, is provided with an upper surface 17, to which a flexible diaphragm 20 is attached by providing an L-shaped peripheral member 22 that has a plurality of fasteners 24 that pass from the top angle portion thereof through the diaphragm in position. Sealingly mounted through the bottom wall 10 are a plurality of test probe receptacles 26, each of which is connected by an electrical lead such as 28 to a test apparatus. Also passing through and sealed to the bottom wall 10 is a vacuum conduit 30 which has connected thereto a hose 32 that leads to a vacuum source associated with the test apparatus.

An intermediate plate 36 has a plurality of pins such as 38, 38' depending therefrom, which pass through sealing bushings 40, 40' and thence through the bottom wall 10. A plurality of springs 42 are received in counterbores in the bottom wall 10 and normally space the intermediate plate 36 at a distance above the bottom wall 10, but parallel to its planar extent. A plurality of apertures such as 46, 46' are formed in the intermediate plate 36 through which the test probe receptacles 26 may pass. So that sealing of the intermediate plate 36 to the receptacles 26 may be had as the plate 36 reciprocates, a thin gasket material such as sheet rubber 48, is secured to the underside of the intermediate plate 36; and this gasket material has holes cut therein which are slightly smaller than the external diameter of the receptacles 26. A vacuum conduit 50 is secured by sealant to the intermediate plate 36 and this conduit passes through the bottom wall 10 being sealed therein for sliding movement by an O-ring 52. A hose 54 connects the conduit to the vacuum source in the test apparatus. A perimeter wall 56 is secured to the upper surface of intermediate plate 36, being shown in the form of a channel, which will engage the underside of the diaphragm 20 in a position underneath an extending portion of the covers 22, 22'. To limit the upward movement thereof, limit pins 58 pass from side walls 12, 13, 14 into the channel of perimeter wall 56. Since the upper surface of the wall 56 engages the diaphragm 20, a vacuum chamber is created between it and a top wall 60 that also engages the diaphragm 20 as will presently appear.

A top wall 60 is provided with a plurality of apertures 62 in line with the receptacles 26 through which test probes 64 that are received within the receptacles 26 may pass. As is customary in the art, the test probes are spring loaded within the receptacles and as illustrated in the drawings, they have more than one longitudinal dimension, there being shown a short probe 64 and a long probe 66. On the top surface of the top wall 60 is a perimeter gasket 68 and spacers 69, on which the printed circuit board may rest. The top wall 60 is supported for reciprocation relative to the intermediate plate 36 by a plurality of pins such as 70, 70', which pins extend downwardly toward the intermediate plate 36 through bushings located therein, and through sealing O-rings 71, 71'. To maintain the top wall spaced from the intermediate plate a plurality of springs 72, 72' are received in counterbores in the intermediate plate (not shown).

To understand how the test head operates, let us assume that a printed circuit board is placed on the gasket 68 on top of the wall 60. The test apparatus would be programmed so that a vacuum would first be applied through conduit 50 which then will draw the circuit board tightly against the top wall 60, the vacuum being supplied to the undersurface of the circuit board through apertures such as 62. This operation takes a fraction of a second to accomplish, and almost simultaneously with the circuit board being pulled into position and seating properly, the top wall 60 will descend toward the intermediate plate 36. As this is occuring, the test apparatus supplies a vacuum through conduit 30 so that now the intermediate plate 36 along with the top wall 60 is pulled downwardly toward the bottom wall 10 to a position as illustrated in FIG. 3, the conduit 50 sliding through bottom wall 10. Regardless of the length of the probes 64, 66, all of the probes will pass through the apertures 62 and contact the circuit board under test. After the test has been completed, the test apparatus would be suitable programmed to release the vacuum in conduit 30 that allows both the top wall 60 and the intermediate plate 36 to rise under the urgence of the springs 42. In this position, only the longer test probes, such as 66, will contact the circuit board and a functional test can be made of certain parts of the circuitry on the circuit board. After the functional test is completed, vacuum in conduit 50 is released and the top wall rises under the urgence of springs 72.

Should it be desired to change the test probes, it is merely necessary to remove the fastenings 24, 24' which then will release the sealing diaphragm 20 and allow one to remove the top wall 60, thus giving access to all of the test probes and the tops of the receptacles. The pattern of the test probes may then be readily changed to suit a different form of circuit board, and the top wall may then be re-assembled onto the intermediate plate 36, the sealing diaphragm 20 replaced, and the covers 22, 22', for example, placed in position and then relocked.

Referring now to FIG. 5, a modified sealing arrangement for the receptacles 26 is illustrated in which the receptacles 26 are sealingly engaged with the bottom wall 10 as in the previously described arrangement; but the sealing in the intermediate plate 36 is had by counter-boring apertures such as 46 as at 80 and inserting O-rings 82 in these counter-bores. The O-rings are maintained in position by a retainer plate 84 which is secured to the underside of the intermediate plate 36.

It will also be apparent, particularly by viewing FIGS. 2 and 3, that a unique action occurs by virtue of utilizing a sealing diaphragm 20, in that the diaphragm 20 maintains a peripheral seal by engaging the top surface of the perimeter wall channel 56, as well as the top surface of the top wall 60.

In effect there is created a pair of vacuum chambers on either side of the intermediate wall. With virtually no leakage from either chamber, a very efficient test fixture that will operate at low vacuum delivery rates is provided.

I claim:

1. A circuit board testing apparatus having a moveable top wall with an array of apertures therein, said top wall supporting a circuit board in sealing engagement therewith, a bottom wall spaced from the top wall by side walls, a flexible sealing means extending inwardly from the side walls to the top wall, an intermediate plate mounted for reciprocation between the bottom wall and the top wall, said intermediate plate having an upwardly extending perimeter wall portion engaging said sealing means to allow a vacuum to be created between the intermediate plate and the top wall, a plurality of conductive test probe receptacles fixedly mounted on the bottom wall to extend upwardly through the intermediate plate toward the top wall, long and short length probe tips mounted in said receptacles to extend through said apertures in the top wall, means sealing the receptacles to the intermediate plate yet permitting sliding movement therethrough, a first vacuum means connected between the top wall and the intermediate plate, second vacuum means connected between the intermediate plate and the bottom wall, said first vacuum means moving the top wall a first distance to contact the longer length probe tips and second vacuum means moving the top wall and intermediate plate toward the bottom wall to contact the short length probe tips and the longer length probe tips.

2. A circuit board testing apparatus as in claim 1 wherein the receptacles are sealed to the intermediate plate by a sealing gasket.

3. A circuit board testing apparatus as in claim 1 wherein the intermediate plate is mounted for movement relative to the bottom wall on a plurality of pins that pass through bushings in said bottom wall.

4. A circuit board testing apparatus as in claim 1 wherein the top wall is mounted for reciprocation relative to the intermediate plate on a plurality of pins extending from the top wall through apertures in the intermediate plate.

5. A circuit board testing apparatus comprising a fixed bottom wall, said bottom wall having an array of test probe body receptacles sealingly mounted therethrough, said receptacles having probes of two distinct lengths received therein, a top wall spaced from the bottom wall and having a plurality of apertures therethrough through which said probes may extend, an intermediate plate mounted for movement perpendicular to the bottom wall and having perimeter means sealing the plate to the top wall, said receptacles passing through the intermediate plate, means sealing the receptacles to the intermediate plate and yet permit sliding movement therethrough, means mounting said top wall for movement perpendicular to the intermediate plate, means securing a board under test to the top wall, vacuum means for moving the top wall and the intermediate plate toward the bottom wall to contact additional test probes.

* * * * *